(12) United States Patent
Hong et al.

(10) Patent No.: US 8,165,547 B2
(45) Date of Patent: Apr. 24, 2012

(54) APPARATUS AND METHOD FOR ACQUIRING SYNCHRONIZATION TO SUPPORT MULTI-FREQUENCY IN MOBILE COMMUNICATION TERMINAL

(75) Inventors: Ki-Joon Hong, Seoul (KR); In-Chun Lim, Anyang-si (KR); Bong-Gee Song, Seongnam-si (KR); Jin-Woo Roh, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 918 days.

(21) Appl. No.: 12/188,441

(22) Filed: Aug. 8, 2008

(65) Prior Publication Data

US 2009/0042591 A1 Feb. 12, 2009

(30) Foreign Application Priority Data

Aug. 10, 2007 (KR) .......................... 10-2007-0080434

(51) Int. Cl.
*H04B 1/40* (2006.01)
*H04B 1/16* (2006.01)
(52) U.S. Cl. .................. 455/208; 455/75; 455/180.3
(58) Field of Classification Search ............... 455/552.1, 455/75, 76, 208, 265, 180.3; 375/344, 327
See application file for complete search history.

(56) References Cited

U.S. PATENT DOCUMENTS

| 4,817,192 | A  | * | 3/1989  | Phillips et al. ............... 455/75 |
| 6,356,599 | B1 |   | 3/2002  | Lee |
| 7,035,596 | B2 | * | 4/2006  | Sato ............................. 455/76 |
| 7,848,435 | B2 | * | 12/2010 | Jeon et al. ..................... 375/260 |

FOREIGN PATENT DOCUMENTS

| KR | 10-1999-0057168 A | 7/1999 |
| KR | 10-2000-0018442 A | 4/2000 |
| KR | 10-2002-0012238 A | 2/2002 |
| KR | 10-2006-0020058 A | 3/2006 |

* cited by examiner

*Primary Examiner* — Sonny Trinh
(74) *Attorney, Agent, or Firm* — Jefferson IP Law, LLP

(57) ABSTRACT

An apparatus and a method for acquiring synchronization to support multi-frequency in a mobile communication terminal are provided. The apparatus includes a frequency generator, a control signal generator and at least two modems for operating respective Frequency Allocations (FAs) by sharing the frequency generator and the control signal generator. In an embodiment, the frequency generator respectively receives first reference frequency clock signals from an oscillator of each of the at least two modems and generates a second reference frequency clock signal and the control signal generator outputs a signal for controlling the oscillator of each of the at least two modems according to a frequency offset value estimated in each of the at least two modems.

14 Claims, 4 Drawing Sheets

APPARATUS AND METHOD FOR ACQUIRING SYNCHRONIZATION TO SUPPORT MULTI-FREQUENCY IN MOBILE COMMUNICATION TERMINAL

PRIORITY

This application claims the benefit under 35 U.S.C. §119(a) of a Korean patent application filed in the Korean Intellectual Property Office on Aug. 10, 2007 and assigned Serial No. 2007-80434, the entire disclosure of which is hereby incorporated by reference.

BACKGROUND OF THE INVENTION

1. Field of the Invention

The present invention relates to an apparatus and a method for acquiring synchronization to support multi-Frequency Allocation (multi-FA) in a mobile communication terminal. More particularly, the present invention relates to an apparatus and a method for acquiring synchronization by sharing a Voltage Controlled Temperature Compensated Crystal Oscillator (VCTCXO) control signal generator and a baseband digital Phase Locked Loop (PLL) between FAs in a mobile communication terminal which supports the multi-FA.

2. Description of the Related Art

As WiMAX technology is advancing and being applied to mobile access systems, various operation scenarios are being suggested to replace the existing communication service standards. For instance, according to an operation scenario under consideration, one terminal provides multiple services at the same time by supporting a multi-Frequency Allocation (multi-FA). That is, the terminal provides both voice call and data service through one FA and provides a specialized service, such as a broadcasting service, through a separate FA.

To support the multiple services at the same time, a conventional terminal supports the respective FAs by using separate components and paths for each of the FAs of the corresponding services respectively. For example, the terminal of FIG. 1 includes two modems 101 and 111 that are separated from each other to support two services at the same time. When the terminal includes the two separate modems as shown in FIG. 1, the volume of the hardware is increased. Since the modems individually maintain the synchronization, when switching is performed between two FAs or a state mode (e.g., normal mode, sleep mode, and idle mode) is changed, it takes a considerable time to acquire the synchronization. As a more detailed example, when modem 101 of the two modems 101 and 111 normally operates by acquiring the synchronization for a specific FA, and a service using another FA is added in conformity with the mobile WiMAX standard, the other modem 111 operates separately from the specific FA and initiates frequency and time offset estimation to acquire the synchronization of the other FA.

FIG. 2 is a flowchart illustrating a conventional method of a mobile communication terminal for acquiring synchronization for two FAs.

In step 201, the terminal determines whether a service using a first FA commences. When the service using the first FA commences, the terminal acquires synchronization by estimating frequency and time offset values for the first FA in step 203 and enters a normal state with respect to the first FA in step 205. Then, the terminal proceeds to step 207. When the service using the first FA does not commence in step 201, the terminal goes to step 207 without intervening steps 203 and 205.

In step 207, the terminal determines whether a service using a second FA commences or not. When the service using the second FA commences, the terminal acquires synchronization by estimating frequency and time offset values of the second FA in step 209. In step 211, the terminal enters a normal state with respect to the second FA and then finishes this process. When the service using the second FA does not commence in step 207, the terminal finishes this process.

As discussed above, the conventional terminal uses two independent modems to support two FAs and the two modems independently acquire the synchronization for their own FA. As a result, the volume of the modem is increased which causes an inconvenience to the user by making the terminal itself larger. Also, it takes a considerable time for the modem to acquire the synchronization of the FA and thus delays the service start time.

SUMMARY OF THE INVENTION

An aspect of the present invention is to address at least the above mentioned problems and/or disadvantages and to provide at least the advantages described below. Accordingly, an aspect of the present invention is to provide an apparatus and a method for acquiring synchronization to support multi-frequency in a mobile communication terminal.

Another aspect of the present invention is to provide an apparatus and a method for acquiring synchronization using a minimum hardware device in a mobile communication terminal which supports multi-frequency.

Yet another aspect of the present invention is to provide an apparatus and a method for minimizing a synchronization acquisition time in a mobile communication terminal which supports multi-frequency.

Still another aspect of the present invention is to provide an apparatus and a method for acquiring synchronization by sharing a Voltage Controlled Temperature Compensated Crystal Oscillator (VCTCXO) control signal generator and a baseband digital Phase Locked Loop (PLL) between FAs in a mobile communication terminal which supports multi-frequency.

In accordance with an aspect of the present invention, an apparatus for acquiring synchronization in a mobile communication terminal to support a multi-frequency is provided. The apparatus includes a frequency generator, a control signal generator and at least two modems for operating respective Frequency Allocations (FAs) by sharing the frequency generator and the control signal generator. In accordance with an aspect of the invention, the frequency generator receives a reference frequency clock from an oscillator of each modem and generates a reference frequency clock and the control signal generator outputs a signal which controls the oscillator of each modem according to a frequency offset value estimated in each modem.

In accordance with another aspect of the present invention, a method for acquiring synchronization in a mobile communication terminal to support a multi-frequency is provided. The method comprises acquiring, at a first modem, synchronization by estimating frequency and time offset values with respect to a first Frequency Allocation (FA) and acquiring, at another modem, synchronization with respect to a second FA using the frequency and time offset values of the first FA.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

An exemplary embodiment of the present invention provides a technique for acquiring synchronization by sharing a Voltage Controlled Temperature Compensated Crystal Oscillator (VCTCXO) control signal generator and a baseband digital Phase Locked Loop (PLL) between Frequency Allocations (FAs) in a mobile communication terminal which supports multi-frequency. Hereafter, the terminal supporting two FAs at the same time is explained by way of example. It is of course to be understood that the present invention is equally applicable to a terminal supporting three or more FAs as well.

Figure 1:
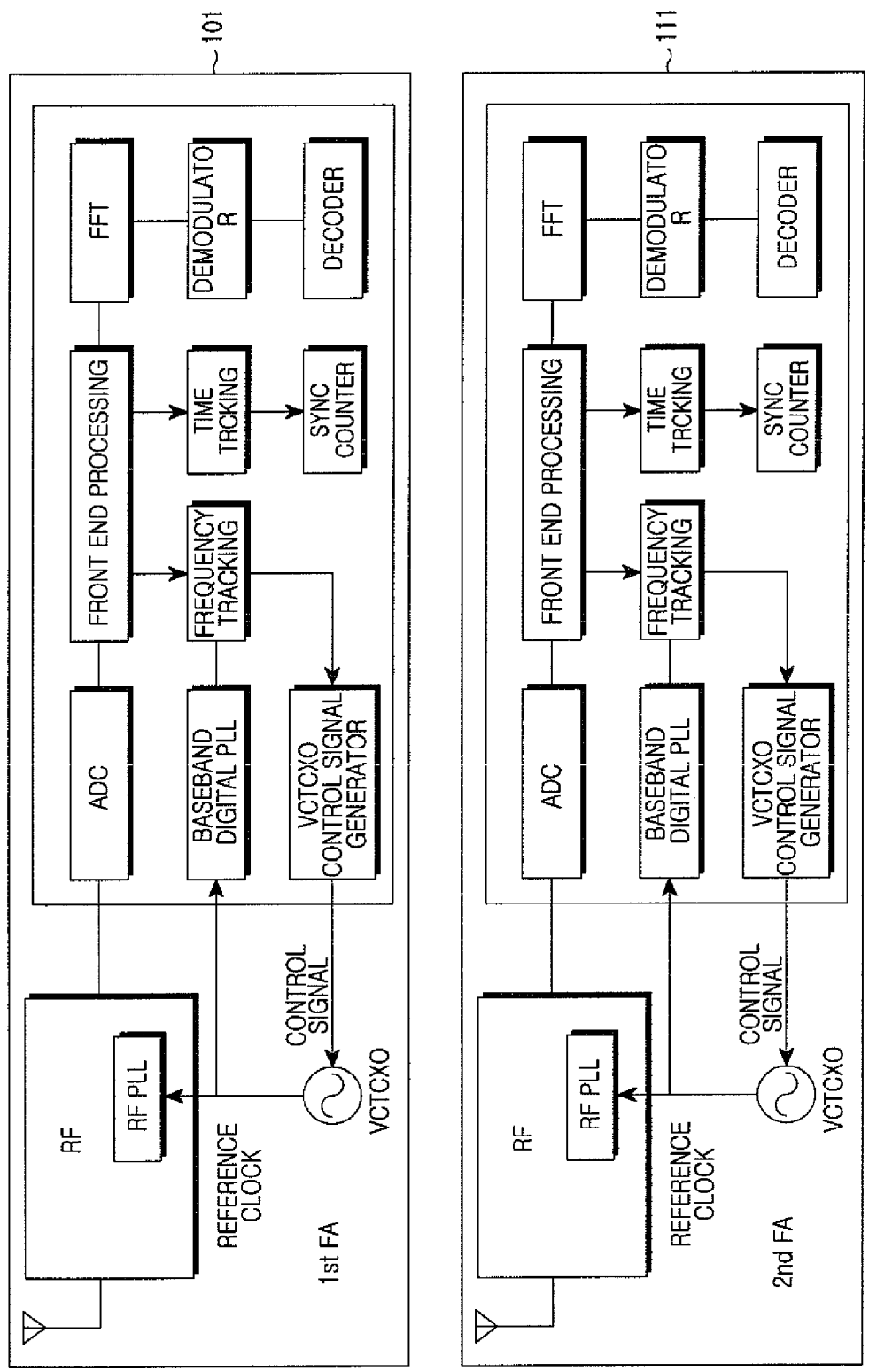
FIG. 1 is a block diagram of a conventional mobile communication terminal which supports two FAs.
Figure 2:
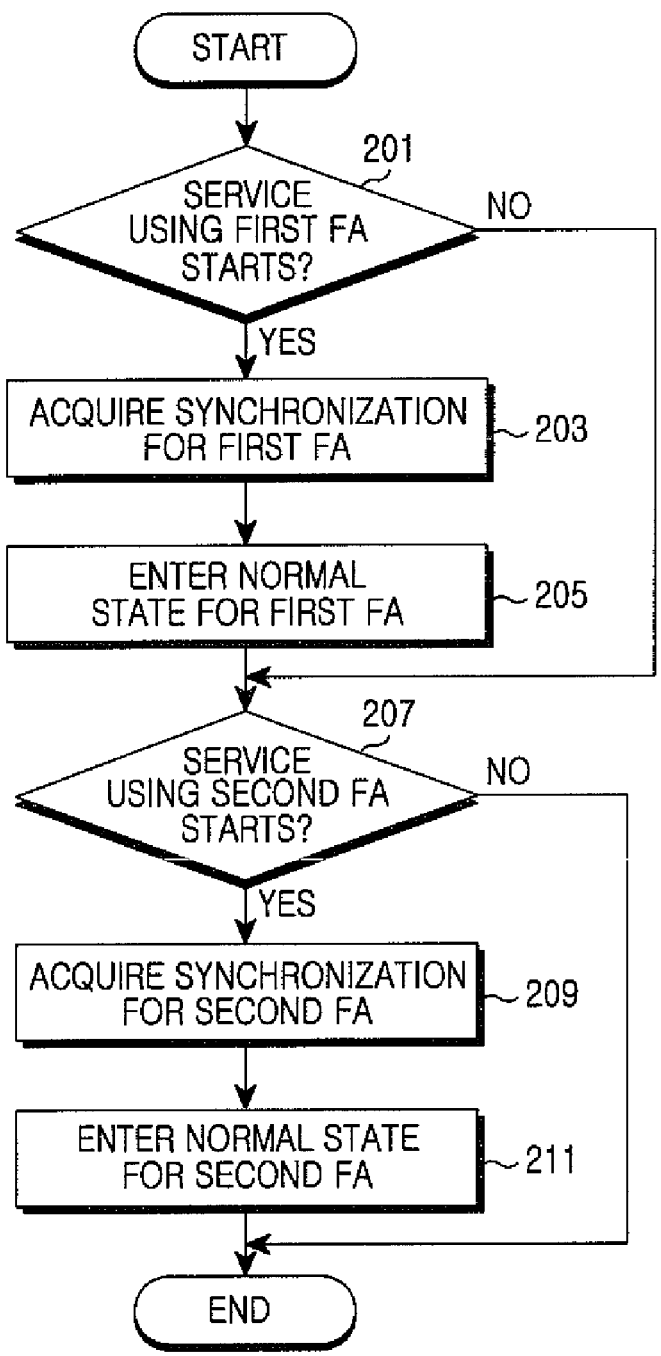
FIG. 2 is a flowchart illustrating a conventional method of a mobile communication terminal for acquiring synchronization for two FAs.
Figure 3:
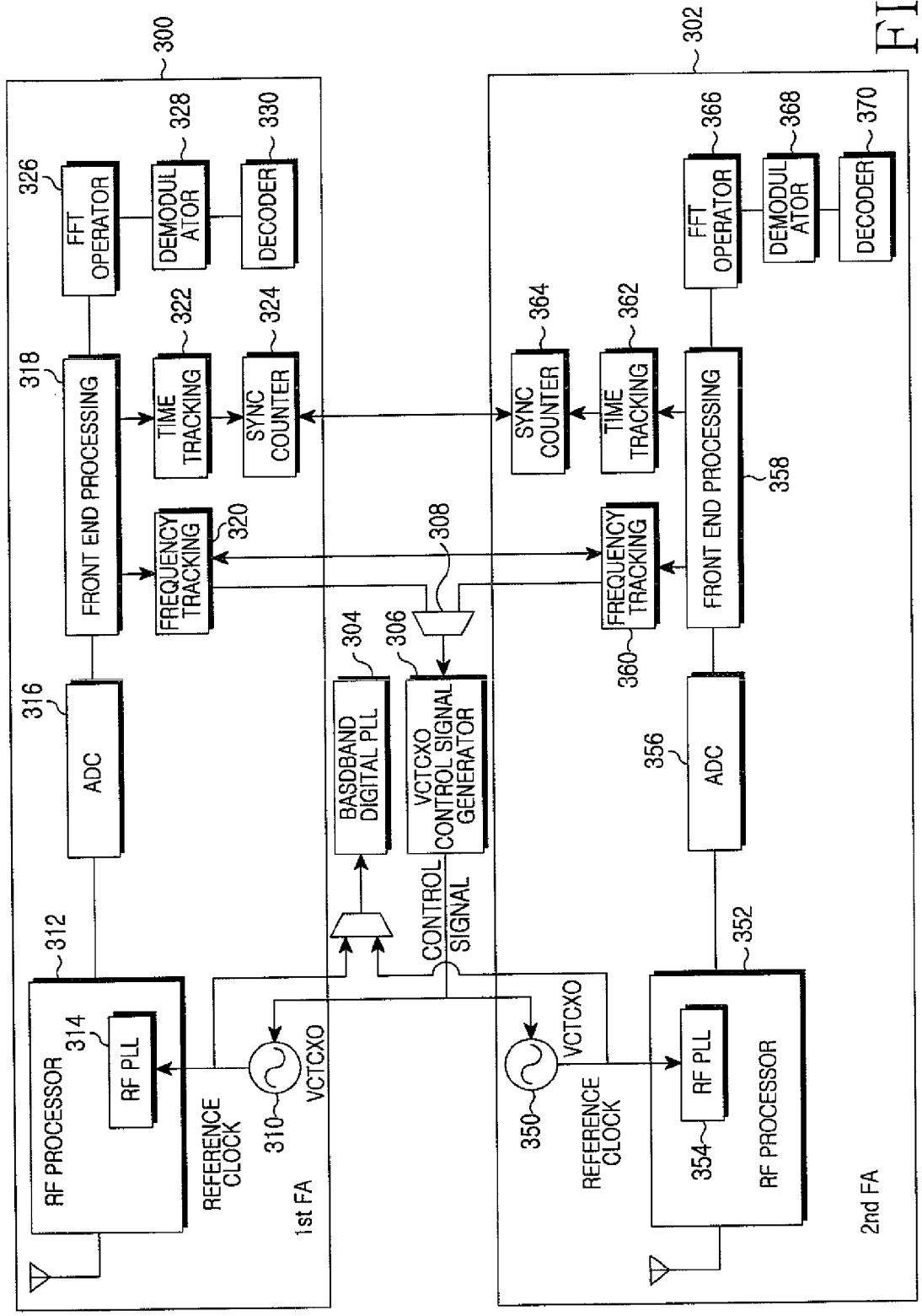
FIG. 3 is a block diagram of a mobile communication terminal for supporting two FAs according to an exemplary embodiment of the present invention.

FIG. 3 is a block diagram of a mobile communication terminal for supporting two FAs according to an exemplary embodiment of the present invention.

Referring to FIG. 3, to support two FAs, the terminal of FIG. 3 includes a first modem 300 and a second modem 302. The two modems 300 and 302 share a baseband digital PLL 304 and a VCTCXO control signal generator 306. FAs in the same network mostly have the same frequency bandwidth. Accordingly, the two modems 300 and 302 can share a reference frequency clock by sharing the baseband digital PLL 304 and the VCTCXO control signal generator 306.

The modems 300 and 302 include VCTCXOs 310 and 350, Radio Frequency (RF) processors 312 and 352, RF PLLs 314 and 354, Analog/Digital Converters (ADCs) 316 and 356, front end processors 318 and 358, frequency trackers 320 and 360, time trackers 322 and 362, sync counters 324 and 364, Fast Fourier Transform (FFT) operators 326 and 366, demodulators 328 and 368, and decoders 330 and 370, respectively.

Now, exemplary operations of the components of FIG. 3 are described.

The baseband digital PLL 304 receives reference clock signals output from the two VCTCXOs 310 and 350 of the modems 300 and 302 and generates a frequency clock signal which is a basis of the operation of the terminal.

The VCTCXO control signal generator 306 generates a control signal to control the output frequency of the two VCTCXOs 310 and 350 of the modems 300 and 302, respectively. More specifically, the VCTCXO control signal generator 306 controls the corresponding VCTCXOs 310 and 350 by receiving an estimated frequency offset value from the frequency trackers 320 and 360 of the modems 300 and 302 and issuing a signal to control the output frequency according to the frequency offset value. Particularly, the VCTCXO control signal generator 306 controls the output frequency of the corresponding VCTCXOs 310 and 350 by changing an input path of the frequency offset value through a path selector 308 depending on an operation state of the current multi-FA. For example, if the first modem 300 has acquired synchronization for the first FA, when the second modem 302 is to acquire synchronization for the second FA, the VCTCXO control signal generator 306 controls the VCTCXO 350 of the second modem 302 using the frequency offset value output from the frequency tracker 320 of the first modem 300. That is, in the synchronization acquisition for the first FA and the second FA, the VCTCXO control signal generator 306 controls the VCTCXO 310 of the modem 300 which operates the first FA using the frequency offset value of the first FA of which the synchronization is first acquired, and controls the VCTCXO 350 of the modem 302 which operates the second FA, at the same time. When the FA of the previously acquired synchronization is disabled and the corresponding modem is suspended, the VCTCXO control signal generator 306 changes a control path to get the frequency offset estimation value from the frequency tracker 320 or 360 of the enabled FA.

The VCTCXOs 310 and 350 output a specific frequency according to the input voltage. The VCTCXOs 310 and 350 regulate the output frequency depending on the control signal fed from the VCTCXO control signal generator 306, and output the regulated frequency to the RF PLLs 314 and 354 and the baseband digital PLL 304.

The RF processors 312 and 352 including the RF PLLs 314 and 354 convert an RF signal received over an antenna to a baseband signal and output the baseband signal to the ADCs 316 and 356. The ADCs 316 and 356 convert the received analog baseband signal to a digital signal and output the digital signal to the front end processors 318 and 358. The front end processors 318 and 358, which control communications, transmit and receive messages based on the input signal, assemble and disassemble packets, and detect and correct error.

The frequency trackers 320 and 360 estimate the frequency offset for the corresponding FA from the signal output from the front end processors 318 and 358 and output the estimated frequency offset value to the VCTCXO control signal generators 304 and 306. Particularly, when the correspondent modem has already acquired the frequency synchronization for a specific FA, the frequency trackers 320 and 360 do not directly estimate the frequency offset value for the corresponding FA but utilize the frequency offset value estimated by the correspondent modem. For example, when the first modem 300 acquires the frequency synchronization through the frequency tracker 320, the frequency tracker 360 of the second modem 302 receives the estimated frequency offset value from the frequency tracker 320 of the first modem 300. In doing so, depending on the construction of the terminal, the frequency trackers 320 and 360 may utilize the frequency offset value estimated by the correspondent modem or estimate a more accurate frequency offset value of the corresponding FA using the frequency offset value estimated at the correspondent modem.

The time trackers 322 and 362 estimate the time offset for the corresponding FA from the signal output from the front end processors 318 and 358 and output the time offset to the sync counters 324 and 364. The sync counters 324 and 364 locate the start point of the frame by acquiring the time synchronization using the estimated time offset value. The two sync counters 324 and 364 transmit and receive the time offset value with each other, and more accurately estimate the time offset value for the corresponding FA based on the time offset value acquired from the sync counters 324 and 364 of the correspondent modem. More specifically, when the first modem 300 acquires the time synchronization through the sync counter 324, the sync counter 364 of the second modem 302 receives the time offset value from the sync counter 324 of the first modem 300, estimates the more accurate time offset value for the corresponding FA, and thus acquires the time synchronization. Herein, the acquired time synchronization is sustained at the sync counters 324 and 364 respectively.

The FFT operators 326 and 366 FFT-process the data output from the front end processors 318 and 358 and output the frequency-domain data to the demodulators 328 and 368. The demodulators 328 and 368 demodulate the data output from the FFT operators 326 and 366 and output the demodulated data to the decoders 330 and 370. The decoders 330 and 370 decode the demodulated signal.

Figure 4:
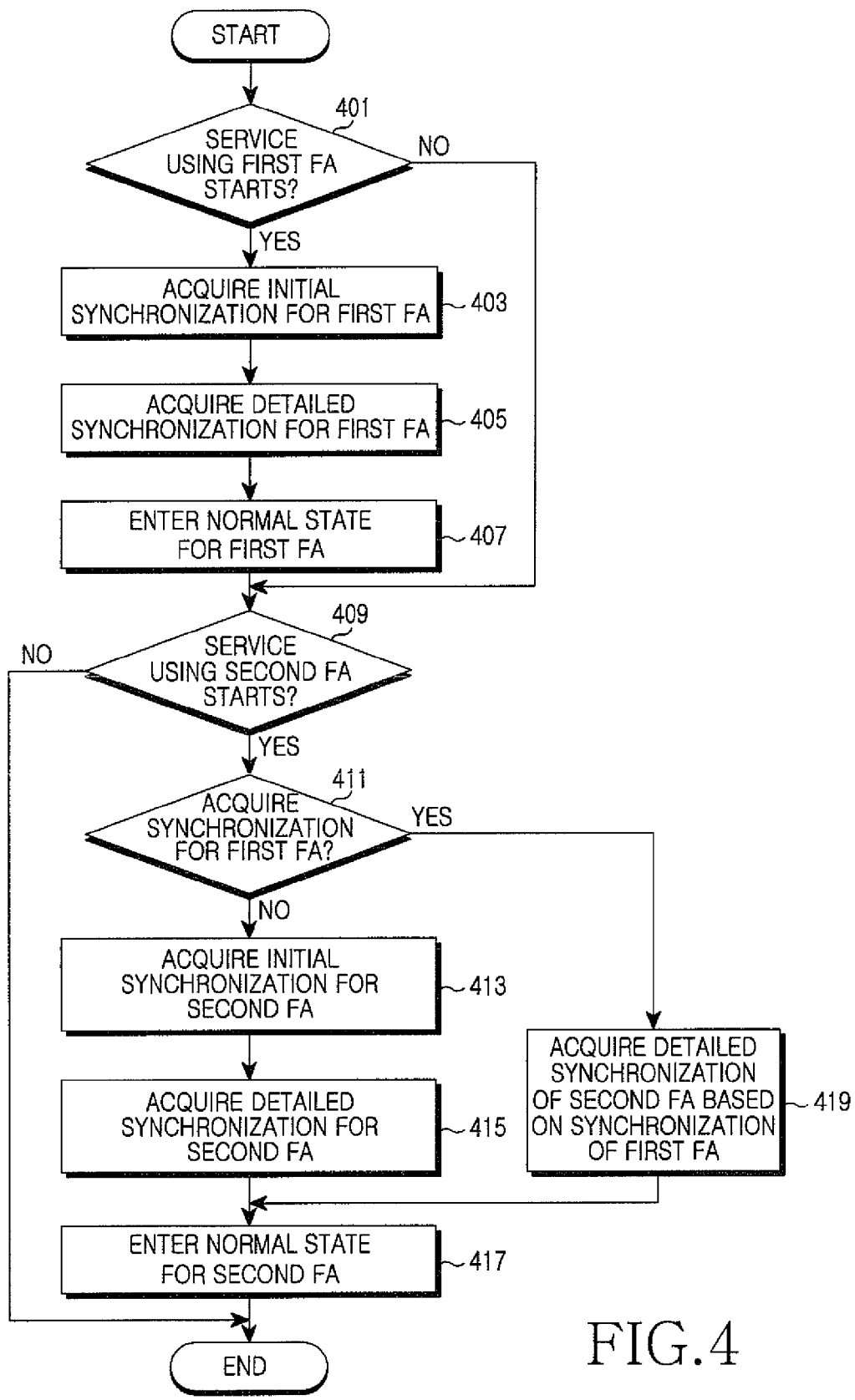
FIG. 4 is a flowchart illustrating a method for acquiring synchronization for two FAs in a mobile communication terminal according to an exemplary embodiment of the present invention.

FIG. 4 is a flowchart illustrating a method for acquiring synchronization for the two FAs in the mobile communication terminal according to an exemplary embodiment of the present invention.

Referring to FIG. 4, in step 401, the terminal determines whether the service using the first FA commences or not. When the service using the first FA commences, the terminal acquires initial synchronization for the first FA in step 403 and acquires detailed synchronization for the first FA in step 405. More specifically, the initial synchronization acquisition in step 403 estimates the approximate frequency offset value and the time offset value and then estimates the basis point of the frame with some error. Also, the detailed synchronization acquisition in step 405 indicates more accurate estimation of the frequency and time offset values acquired in the initial synchronization acquisition. Mostly, the terminal acquires the synchronization by estimating the frequency and time offsets through a specific signal preset with the base station.

Next, the terminal enters the normal state for the first FA in step 407 and proceeds to step 409. When the service using the first FA does not start in step 401, the terminal goes to step 409.

In step 409, the terminal determines whether a service using the second FA commences or not. When the service using the second FA commences, the terminal determines whether the synchronization for the first FA is acquired in advance in step 411.

When the synchronization is acquired for the first FA in advance, the terminal acquires the detailed synchronization for the second FA based on the frequency and time offset values estimated in the initial synchronization acquisition of the first FA in step 419 and goes to step 417.

Typically, every FA has the frame basis at regular intervals and keeps the same first start point of the frame. Accordingly, given two FAs serviceable to the terminal at the same point, frames of the two FAs start at the same point so that the terminal can locate the start point of the frame after a delay time according to the distance to the FA. In more detail, based on the first FA, the frame start point of the second FA can be located within a certain range from the frame start point of the first FA. Hence, without the initial synchronization acquisition which locates the approximate start point of the second FA frame, the terminal can locate the start point of the frame for the second FA using the start point of the frame for the first FA in step 419.

In contrast, when the synchronization for the first FA is not acquired in advance, the terminal acquires the initial synchronization for the second FA in step 413, acquires the detailed synchronization for the second FA in step 415, and proceeds to step 417.

In step 417, the terminal enters the normal state with respect to the second FA and then finishes the process. When the service using the second FA does not start in step 409, the terminal finishes the process.

In FIG. 4, it has been illustrated that the synchronization of the second FA is acquired depending on whether the synchronization of the first FA is acquired in advance or not. In other exemplary embodiments of the present invention, the synchronization of the first FA is acquired depending on whether the synchronization of the second FA is acquired in advance or not.

As set forth above, the mobile communication terminal supporting the multi-frequency acquires the synchronization by sharing the VCTCXO control signal generator and the baseband digital PLL between the FAs. Therefore, the total synchronization acquisition time can be reduced by using the frequency and time offset estimate values of the FA of the previously acquired synchronization for the synchronization acquisition of the other FA, and the volume of the hardware device can be decreased.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for acquiring synchronization in a mobile communication terminal to support multi-frequency, the apparatus comprising:
    a frequency generator;
    a control signal generator; and
    at least two modems for operating respective Frequency Allocations (FAs) by sharing the frequency generator and the control signal generator,
    wherein the frequency generator respectively receives first reference frequency clock signals from an oscillator of each of the at least two modems and generates a second reference frequency clock signal.

2. The apparatus of claim 1, wherein the control signal generator outputs a signal for controlling the oscillator of each of the at least two modems according to a frequency offset value estimated in each of the at least two modems.

3. The apparatus of claim 2, wherein each of the at least two modems comprises a frequency tracker for estimating the frequency offset value.

4. The apparatus of claim 3, wherein the frequency tracker of a first modem shares its frequency offset value with a frequency tracker of the other of the at least two modems.

5. The apparatus of claim 4, wherein, when a first of the at least two modems acquires synchronization for a specific FA, the frequency tracker of a second of the at least two modems estimates a frequency offset value for its corresponding FA using a frequency offset value estimated at the frequency tracker of the first modem.

6. The apparatus of claim 2, wherein each of the at least two modems comprise:
   a time tracker for estimating a time offset; and
   a sync counter for acquiring and sustaining time synchronization using the estimated time offset value.

7. The apparatus of claim 6, wherein the sync counter of a first modem shares its time offset value with the sync counter of the other of the at least two modems.

8. The apparatus of claim 6, wherein, when a first of the at least two modems acquires synchronization for a specific FA, the sync counter of a second of the at least two modems estimates a time offset value of its corresponding FA using a time offset value estimated at a time tracker of the first modem.

9. The apparatus of claim 2, wherein the control signal generator receives a frequency offset value from an operating modem of the FA of a previously acquired synchronization, and receives a frequency offset value from another modem operating the FA when the FA of the modem which provides the frequency offset value is suspended.

10. The apparatus of claim 9, wherein, when synchronization of the first FA is acquired and then synchronization acquisition of the second FA is attempted, the control signal generator controls an oscillator of a modem which operates the second FA, using a frequency offset value estimated at a modem which operates the first FA.

11. A method for acquiring synchronization in a mobile communication terminal to support multi-frequency, the method comprising:
   acquiring, at a first modem, synchronization by estimating frequency and time offset values with respect to a first Frequency Allocation (FA); and
   acquiring, at another modem, synchronization with respect to a second FA using the frequency and time offset values of the first FA.

12. The method of claim 11, wherein the acquiring of the synchronization for the first FA comprises:
   estimating initial frequency and time offset values having an error within a threshold value with respect to the first FA; and
   acquiring synchronization by estimating more accurate frequency and time offsets using the estimated initial frequency and time offsets.

13. The method of claim 12, wherein the acquiring of the synchronization for the second FA comprises:
   estimating initial frequency and time offset values having an error within a threshold value with respect to the second FA; and
   acquiring synchronization by estimating more accurate frequency and time offsets using the estimated initial frequency and time offsets.

14. The method of claim 11, wherein the acquiring of the synchronization for the second FA comprises:
   receiving, at the another modem, the frequency and time offset values of the first FA from the first modem; and
   acquiring synchronization by estimating frequency and time offsets for the second FA based on the received frequency and time offset values.

* * * * *